(12) United States Patent
Villano et al.

(10) Patent No.: US 10,790,739 B1
(45) Date of Patent: Sep. 29, 2020

(54) REDUNDANT POWER SUPPLY HAVING DIVERSE DUAL CONTROLLERS

(71) Applicant: Hamilton Sundstrand Corporation, Charlotte, NC (US)

(72) Inventors: William E. Villano, Canton, CT (US); Kirk A. Lillestolen, East Hartland, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/425,321

(22) Filed: May 29, 2019

(51) Int. Cl.
| | |
|---|---|
| *H02M 1/32* | (2007.01) |
| *B64D 41/00* | (2006.01) |
| *H02M 1/088* | (2006.01) |
| *H02M 3/335* | (2006.01) |
| *H03K 19/21* | (2006.01) |

(52) U.S. Cl.
CPC .............. *H02M 1/32* (2013.01); *B64D 41/00* (2013.01); *H02M 1/088* (2013.01); *H02M 3/33569* (2013.01); *B64D 2221/00* (2013.01); *H03K 19/21* (2013.01)

(58) Field of Classification Search
CPC .... H02M 1/32; H02M 1/088; H02M 3/33569; B64D 41/00; H03K 19/21
See application file for complete search history.

(56) References Cited

U.S. PATENT DOCUMENTS

| | | | |
|---|---|---|---|
| 5,894,413 | A | 4/1999 | Ferguson |
| 9,628,101 | B1 * | 4/2017 | Onishi ................ H03M 1/185 |
| 9,955,549 | B2 | 4/2018 | Zhang et al. |

(Continued)

FOREIGN PATENT DOCUMENTS

| | | |
|---|---|---|
| EP | 1801960 A2 | 6/2007 |
| EP | 1801960 A3 | 11/2008 |

(Continued)

OTHER PUBLICATIONS

High Speed Current Mode Pulse Width Modulators, Analog Devices, LT1241, 20 pages.

(Continued)

*Primary Examiner* — Jue Zhang
*Assistant Examiner* — Trinh Q Dang
(74) *Attorney, Agent, or Firm* — Kinney & Lange, P.A.

(57) ABSTRACT

A power supply system with redundant control includes a power conversion unit configured to provide a regulated output voltage, a first power supply controller configured to control the power conversion unit such that the regulated output voltage is within a selected range, a second power supply controller having power supply controller diversity from the first power supply controller configured to control the power conversion unit such that the regulated output voltage is within a selected range, and a controller selector configured to enable either the first power supply controller or the second power supply controller in response to a control signal from a logic control circuit. The power supply controller diversity can be duty cycle diversity, frequency diversity, power supply requirement diversity, manufacturer diversity, part number diversity, foundry diversity, fabrication batch diversity, and/or manufacturing date diversity.

19 Claims, 3 Drawing Sheets

(56) References Cited

U.S. PATENT DOCUMENTS

| | | | |
|---|---|---|---|
| 2008/0315853 A1* | 12/2008 | Capilla | H02M 3/1588 |
| | | | 323/288 |
| 2011/0133711 A1* | 6/2011 | Murakami | H03K 17/0822 |
| | | | 323/282 |
| 2012/0051094 A1* | 3/2012 | George | H02M 3/3376 |
| | | | 363/17 |
| 2013/0002179 A1 | 1/2013 | Ozaki et al. | |
| 2014/0210445 A1* | 7/2014 | Hasegawa | H04W 48/04 |
| | | | 323/284 |
| 2014/0281638 A1 | 9/2014 | Drobnik | |
| 2018/0097443 A1* | 4/2018 | Couleur | H02M 3/07 |

FOREIGN PATENT DOCUMENTS

| | | |
|---|---|---|
| EP | 2878501 A1 | 6/2015 |
| WO | 2018053680 A1 | 3/2018 |
| WO | 2018223741 A1 | 12/2018 |

OTHER PUBLICATIONS

Development Assurance of Airborne Electronic Hardware, EASA Certification Memorandum, Aug. 11, 2011, 66 pages, Issue 1, Software & Complex Electronic Hardware section.

Extended European Search Report dated Jul. 2, 2020, received for corresponding European Application No. 19213333.8, 6 pages.

* cited by examiner

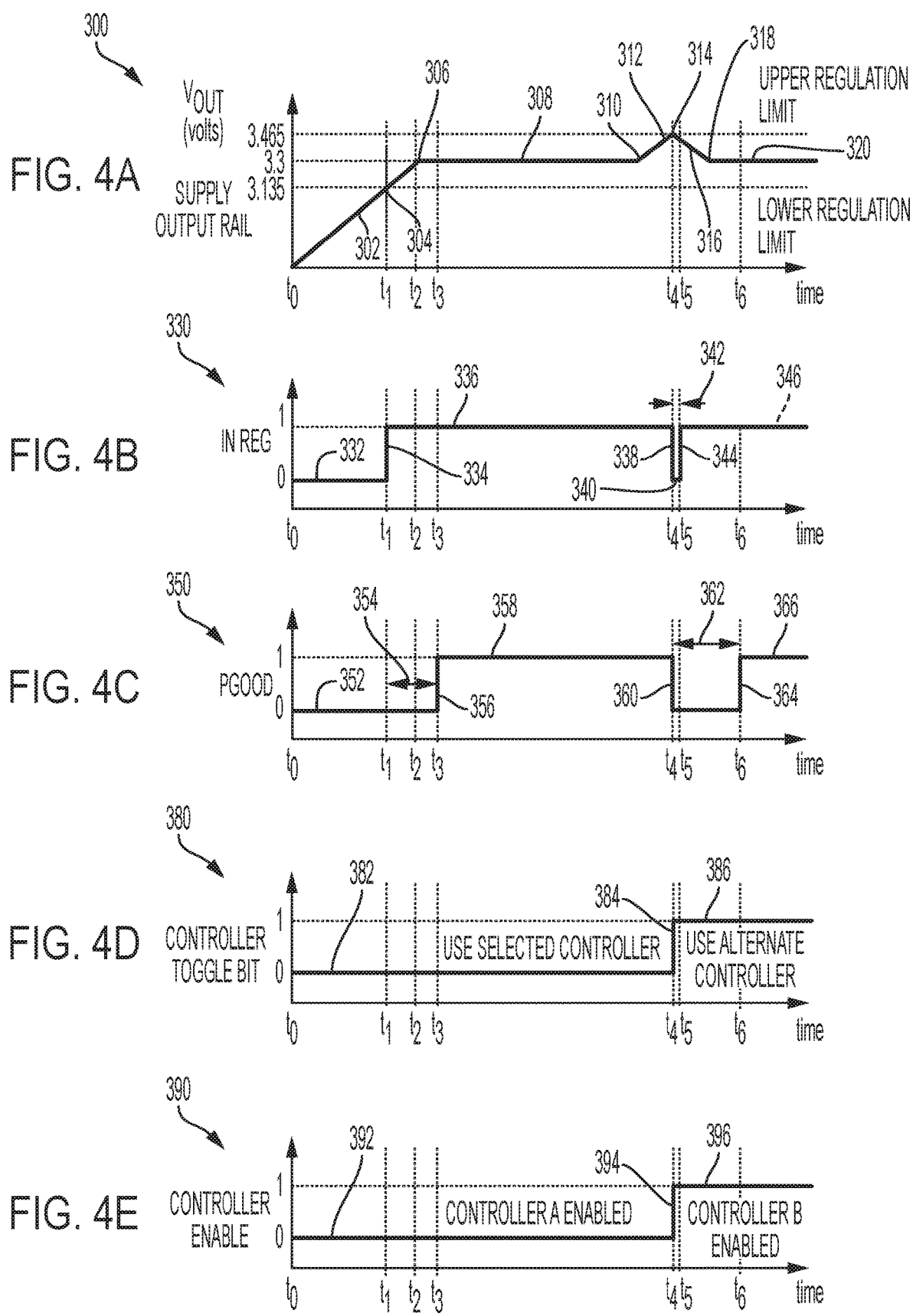

REDUNDANT POWER SUPPLY HAVING DIVERSE DUAL CONTROLLERS

BACKGROUND

The present application relates to electrical power supplies, and more particularly, a fault-tolerant power supply architecture.

Power supplies are used aboard aircraft systems for producing a regulated direct current (DC) voltage for various electronic circuits. Typically, a loosely regulated bus provides the source of electrical power for various power supplies. Many electronic circuits are required to be redundant to enhance system availability and reduce failure rates to support system-level safety requirements. Often, these redundant control circuits and their associated power supplies are identical. Although redundancy can provide some level of failure mitigation in the event of random failures of either supply, identical redundant power supplies can be vulnerable to a common-mode failure that can affect both power supplies in a similar manner. Such failures can thereby interrupt the supply of power to both copies of the electronic circuit. Accordingly, there is a need for a redundant power supply controller architecture that reduces the risk of interrupting the supply of electrical power to a circuit by mitigating common-mode failure mechanisms.

SUMMARY

A power supply system for converting electrical power with redundant control includes a power conversion unit configured to provide a regulated output voltage, a first power supply controller configured to control the power conversion unit such that the regulated output voltage is within a selected range, a second power supply controller having power supply controller diversity from the first power supply controller configured to control the power conversion unit such that the regulated output voltage is within a selected range, and a controller selector configured to enable either the first power supply controller or the second power supply controller in response to a control signal from a logic control circuit. The power supply controller diversity can be duty cycle diversity, frequency diversity, power supply requirement diversity, manufacturer diversity, part number diversity, foundry diversity, fabrication batch diversity, and/or manufacturing date diversity.

A method for converting electrical power with redundant control includes providing a regulated output voltage by a power conversion unit, controlling the power conversion unit by a first power supply controller such that the regulated output voltage is within a selected range, controlling the power conversion unit by a second power supply controller having a power supply controller diversity from the first power supply controller such that the regulated output voltage is within a selected range, and enabling, by a controller selector, either the first power supply controller or the second power supply controller in response to a control signal from a logic control circuit. The power supply controller diversity can be duty cycle diversity, frequency diversity, power supply requirement diversity, manufacturer diversity, part number diversity, foundry diversity, fabrication batch diversity, and/or manufacturing date diversity.

BRIEF DESCRIPTION OF THE DRAWINGS

FIG. 4A is a waveform showing the output voltage from the redundant power supply controller.

FIG. 4B is a waveform showing the in regulation status of the redundant power supply controller.

FIG. 4C is a waveform showing the power good status of the redundant power supply controller.

FIG. 4D is a waveform showing the controller toggle bit status of the redundant power supply controller.

FIG. 4E is a waveform showing the controller enabled status of the redundant power supply controller.

DETAILED DESCRIPTION

Figure 1:
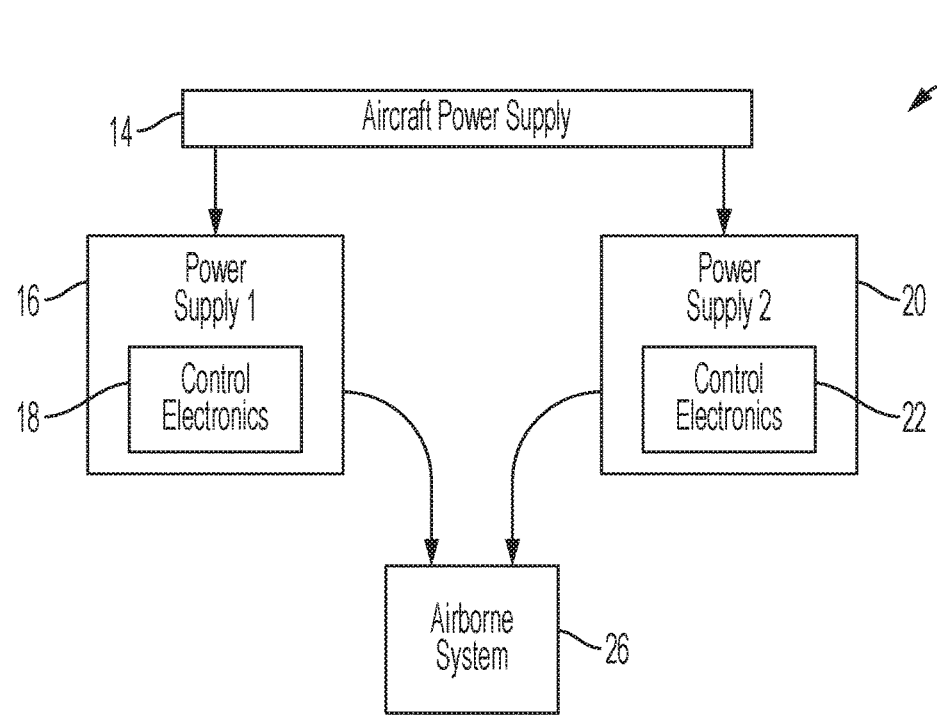
FIG. 1 is a schematic block diagram of a redundant power supply control system of the prior art.
Figure 2:
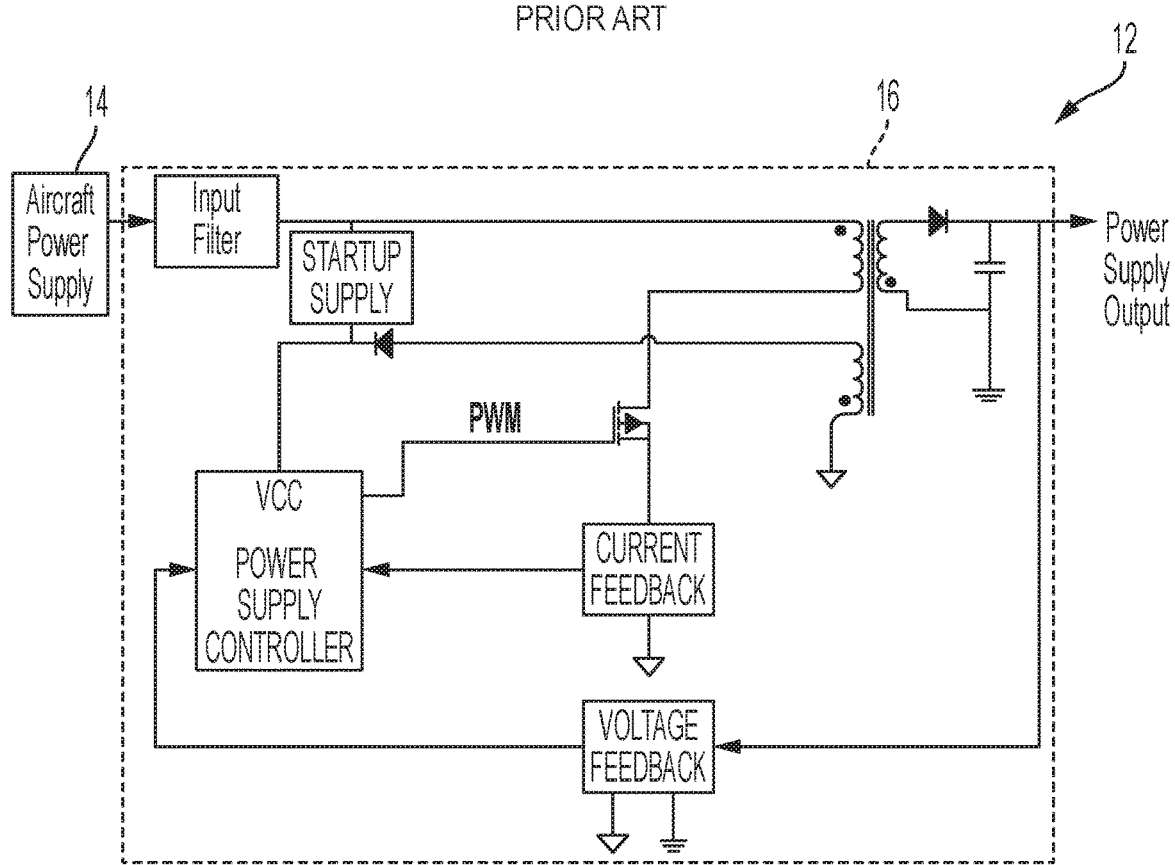
FIG. 2 is a schematic block diagram of a power supply controller of the prior art.

FIG. 1 is a schematic block diagram of a redundant control system of the prior art. FIG. 2 is a schematic block diagram of a power supply controller in FIG. 1. Shown in FIGS. 1-2 are dual power supply 10, aircraft power supply 14, first power supply 16, control electronics 18, second power supply 20, control electronics 22, and airborne system 26. Dual power supply 10 can be used for providing reliable electrical power to airborne system 26 by having separate first and second power supplies 16, 20, each of which receive input power from aircraft power supply 14 and produce a regulated supply voltage at the appropriate voltage level for airborne system 26. First and second power supplies 16, 20 each include the respective control electronics 18, 22, with exemplary first power supply 16 shown in FIG. 2. In the illustrated embodiment, first and second power supplies 16, 20 use pulse width modulation (PWM) for power conversion. Various means of selecting between the first and second power supply 16, 20 can be used in the event that either first or second power supply 16, 20 fails during operation. In some embodiments, a third or more power supply can be used with first and second power supplies 16, 20 to achieve a desired level of redundancy. In other embodiments, other various means of power conversion can be used (e.g., including AC and/or DC supply voltages).

In a typical embodiment, first and second power supplies 16, 20, including associated control electronics 18, 22, are identical circuits that are made from commercial off-the-shelf (COTS) electronic components. Being identical in circuit design and manufacture, first and second power supplies 16, 20 can typically be vulnerable to a common-mode fault and/or means of failure. Two separate circuits, each including circuits that share a common-mode fault, can produce erroneous outputs in response to a stress condition. Non-limiting examples of stress conditions include input voltage excursions, current load changes, electromagnetic interference, current overload, electrostatic discharge, mechanical shock, and the thermal environment. A common-mode fault can be known or unknown, and can be introduced into electronic circuits at any stage including, for example, during circuit design, chip fabrication, testing, or circuit assembly. COTS electronic components used in first and second power supplies 16, 20, and/or associated control electronics 18, 22, typically include integrated circuits (ICs) that are fabricated in large batches. A latent defect in ICs that are produced in the same batch can be an example of a common-mode fault. When dual power supply 10 is providing electrical power to airborne system 26 and a common-mode failure occurs, both first and second power supplies 16, 20 can fail at or near the same time, thereby interrupting the supply of electrical power to airborne system 26. This can be disadvantageous when it is desired that airborne system 26 remain energized during operation.

Figure 3:
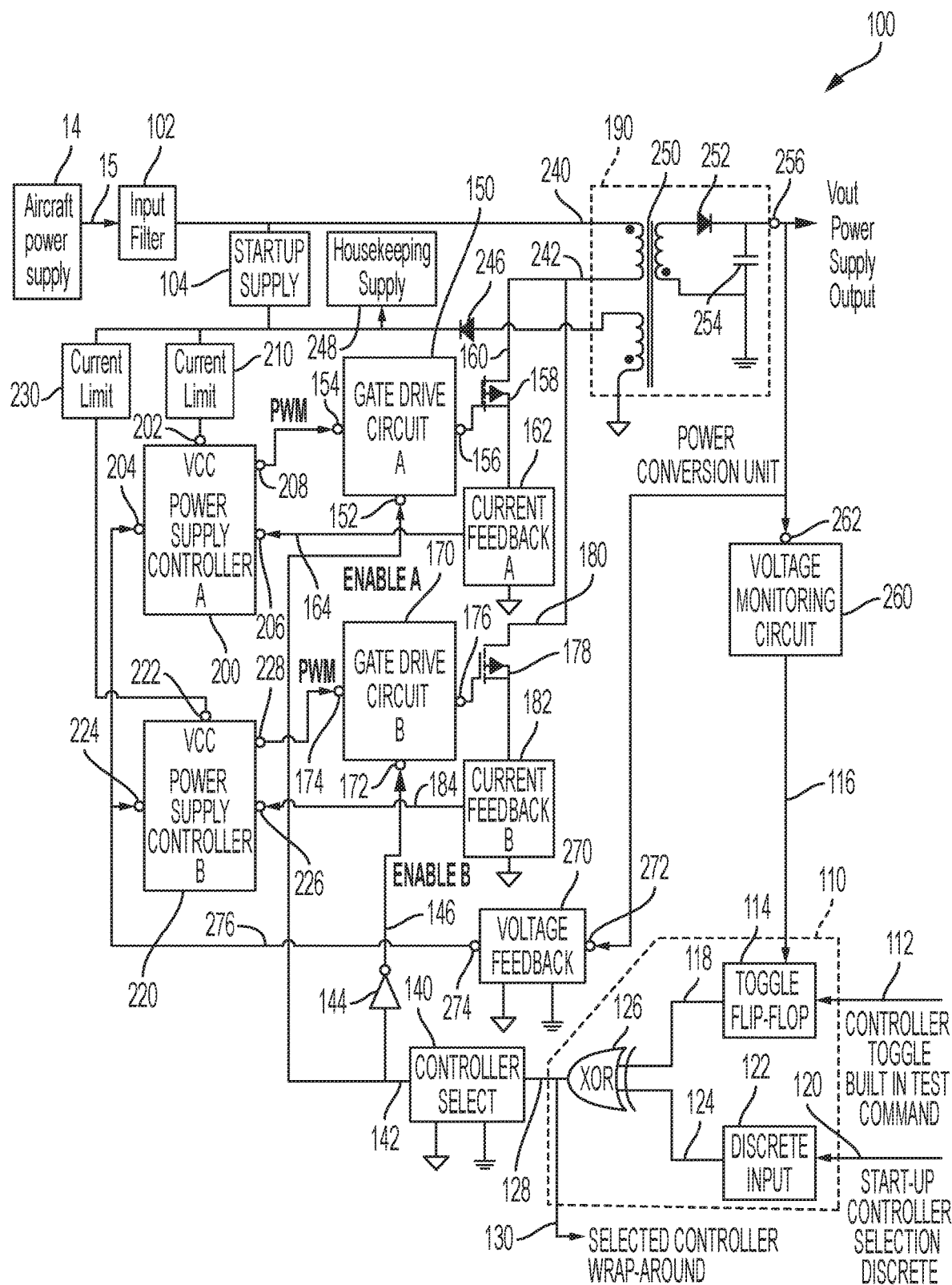
FIG. 3 is a schematic block diagram of a redundant power supply controller.

FIG. 3 is a schematic block diagram of a redundant power supply controller. Shown in FIG. 3 are aircraft power supply 14, power supply input 15, redundant power supply controller 100, input filter 102, startup supply 104, controller selector circuit 110, controller toggle input 112, controller toggle flip-flop 114, voltage monitoring input 116, controller toggle flip-flop output 118, startup controller selection input 120, discrete input selector 122, discrete input selector output 124, exclusive OR gate 126, exclusive OR gate output 128, selected controller wrap-around signal 130, controller selector 140, controller selector output 142, inverting gate 144, controller selector inverted output 146, gate drive circuit A 150, gate drive circuit A enable 152, channel A modulating input 154, gate drive circuit A output 156, MOSFET A 158, gate A current path 160, channel A current feedback device 162, channel A current feedback signal 164, gate drive circuit B 170, gate drive circuit B enable 172, channel B modulating input 174, gate drive circuit B output 176, MOSFET B 178, gate B current path 200, channel B current feedback device 202, channel B current feedback signal 204, power conversion unit 190, power supply controller A 200, controller A supply voltage 202, controller A voltage feedback signal 204, controller A current feedback signal 206, controller A modulating output signal 208, channel A current limiter 210, power supply controller B 220, controller B supply voltage 222, controller B voltage feedback signal 224, controller B current feedback signal 226, controller B modulating output signal 228, channel B current limiter 230, power conversion unit supply current 240, power conversion unit drain current 242, internal supply diode 244, housekeeping supply 246, transformer 250, power output rectifier 252, power supply capacitor 254, power supply output 256, voltage monitoring circuit 260, voltage level input terminal 262, voltage feedback device 270, voltage feedback device input 272, voltage feedback device output 274, and voltage feedback signal 276. Controller toggle input 112 and startup controller selection input 120 can be referred to as external input signals.

During operation, aircraft power supply 14 provides electrical power at power supply input 15 to redundant power supply controller 100 via input filter 102. In a typical embodiment, aircraft power supply 14 provides unregulated 28 Volt power input, which can be subject to voltage fluctuations during operation. As used in this disclosure, all voltages will be direct current (DC) voltages, unless stated otherwise. Startup supply 104 receives the unregulated voltage from power supply input 15 at input filter 102 and provides electrical power to the various electronic circuits within redundant power supply controller 100 prior to stable operation of redundant power supply controller 100. As will be described, redundant power supply controller 100 includes two channels which are labeled as "A" and "B". Channel A can be referred to as a first channel (i.e., a first power supply controller, etc.), and channel B can be referred to as a second channel (i.e., a second power supply controller, etc.) Controller selector circuit 110 includes controller toggle flip-flop 114, discrete input selector 122, and exclusive OR gate 126. Controller toggle input 112 provides an input to controller toggle flip-flop 114 that will instruct redundant power supply controller 100 to switch between controllers during system testing. For example, a built-in test (BIT) can invoke controller toggle input 112 to direct controller toggle flip-flop 114 to alternate between controllers. During normal operation of redundant power supply controller 100, an input at controller toggle input 112 can also cause controllers to be switched. Voltage monitoring input 116 provides an indication of the output voltage level from redundant power supply controller 100, as will be described. Controller toggle flip-flop 114 is a two-state logic device having an output that can be represented as a binary "1" or "0" (hereafter, 1 or 0, respectively), and will switch states (i.e., either from 0 to 1, or from 1 to 0) in response to an input from either controller toggle input 112 or voltage monitoring input 116, providing controller toggle flip-flop output 118 as an input to exclusive OR gate 126. Startup controller selection input 120 provides an input to discrete input selector 122 that is indicative of which controller to be used during system startup, with discrete input selector 122 providing discrete input selector output 124 as a second input to exclusive OR gate 126. Exclusive or gate 126 is a two-state logic device having an output of either 1 or 0 in response to controller toggle flip-flop output 118 and discrete input selector output 124. Exclusive or gate output 128 from exclusive OR gate 126 is 1 if controller toggle flip-flop output 118 and discrete input selector output 124 are not the same value. In the illustrated embodiment, when exclusive OR gate output 128 is 1, channel A is enabled. Alternatively, when exclusive OR gate output 128 is 0, channel B is enabled. It is to be appreciated that the binary logic being represented in the present disclosure is exemplary, and that in other embodiments, different logic functions can be used to specify between the first and second channels.

Referring again to FIG. 3, exclusive OR gate output 128 is supplied as selected controller wrap-around signal 130, which can provide an indication of which controller is selected. Controller wrap-around signal 130 can be used to test controller selector circuit 110. Controller toggle input 112 can be used as a built-in test command to verify that a proper response is being provided controller selector circuit 110. Exclusive or gate output 128 is provided to controller selector 140, thereby identifying which channel to be in operation (i.e., channel A or B). Controller selector 140 provides controller selector output 142 as either 0 or 1, with controller selector output 142 being provided to gate drive circuit A 150 at gate drive circuit A enable 152. Controller selector output 142 is inverted by inverting gate 144, the inverted signal being provided to gate drive circuit B 170 at gate drive circuit B enable 172. Accordingly, either gate drive circuit A 150 or gate drive circuit B 170 is enabled at any particular time, depending on the state of controller selector 140.

Gate drive circuit A 150 receives channel A modulating input 154 from power supply controller A 200, which is a signal indicative of the desired power supply voltage to be provided by redundant power supply controller 100, as will be described. When gate drive circuit A 150 is enabled (i.e., 1 is input to gate drive circuit A enable 152), gate drive circuit A output 156 is provided to MOSFET A 158, thereby modulating the conduction of MOSFET A 158 in response to modulating input 154. Accordingly, the modulated conduction of MOSFET A 158 modulates gate A current path 160, thereby modulating current through power conversion unit 190, thereby providing output power from redundant power supply controller 100 at the desired voltage, as will be described. Channel A current feedback device 162 monitors the current flowing through MOSFET A 158 (i.e., gate A current path 160), providing channel A current feedback signal 164 to power supply controller A 200.

Similar to the above description for channel A, gate drive circuit B 170 receives channel B modulating input 174 from power supply controller B 220, which is a signal indicative of the desired power supply voltage to be provided by redundant power supply controller 100, as will be described. When gate drive circuit B 170 is enabled (i.e., 1 is input to gate drive circuit B enable 172), gate drive circuit B output 176 is provided to MOSFET B 178, thereby modulating the conduction of MOSFET B 178 in response to modulating input 174. Accordingly, the modulated conduction of MOSFET B 178 modulates gate B current path 200, thereby modulating current through power conversion unit 190, and thereby providing output power from redundant power supply controller 100 at the desired voltage, as will be described. Channel B current feedback device 202 monitors the current flowing through MOSFET B 178 (i.e., gate B current path 200), providing channel B current feedback signal 204 to power supply controller B 220 if the current exceeds a specified threshold. In the illustrated embodiment, MOSFET A 158 and MOSFET B 178 are metal oxide semiconductor field effect transistors, which are known in the electrical art as electronic switches. In other embodiments, other types of switches can be used in place of MOSFETs, with a non-limiting example including an insulated-gate bipolar transistor (IGBT).

Referring again to FIG. 3, power conversion unit 190 converts the input voltage at power supply input 15 to the desired voltage level to be produced from redundant power supply controller 100, based on the modulation of gate A current path 160 or gate B current path 200, depending on which channel is enabled. Power conversion unit 190 includes transformer 250, which includes a primary winding and one or more secondary windings, whereby a current flowing through the primary winding induces a current in each of the one or more secondary windings by inductive coupling. Power conversion unit 190 includes power output rectifier 252 and power supply capacitor 254, together which the desired DC voltage at power supply output 256. In a typical embodiment, the desired output voltage is a value that is specified for the circuitry being supplied by redundant power supply controller 100 with non-limiting exemplary values being 3.3 V, 5 V, and 12 V. The desired output voltage can be referred to as a selected output voltage. All output voltage values are within the scope of the present disclosure. In the illustrated embodiment, transformer 250 is a fly-back transformer that includes a main secondary winding, for delivering output power, and an auxiliary secondary winding for providing electrical power via internal supply diode 246 to housekeeping supply 248. When redundant power supply controller 100 is first energized, startup supply 104 provides electrical power to the various circuits within redundant power supply controller 100, as described earlier. As the startup of redundant power supply controller 100 continues, with power conversion unit drain current 242 being modulated by MOSFET A 158 or MOSFET B 178, housekeeping supply 248 provides electrical power to the various electronic circuits within redundant power supply controller 100. In some embodiments, transformer 250 can be a transformer different from a fly-back transformer, with a non-limiting example including a forward-mode transformer. In other embodiments, an inductor can be used (e.g., as with a buck or a buck-boost circuit topology). In yet other embodiments, power output rectifier 252 can be a full-wave or bridge rectifier. In yet other embodiments, power conversion unit 190 can be a different circuit configuration that converts the input voltage at power supply input 15 to the desired voltage level to be produced from redundant power supply controller 100, with non-limiting examples including buck converter, boost converter, buck-boost converter, forward converter, and single-ended primary-inductor converter (SEPIC).

Referring again to FIG. 3, power supply controller A 200 receives controller A supply voltage 202 via channel A current limiter 210, and power supply controller B 220 receives controller B supply voltage 222 via channel B current limiter 230. Channel A and B current limiters 210, 230 limit current flow through the respective power supply controller A or B 200, 220, as may occur during a fault condition, thereby not depriving the unaffected power supply controller A or B 200, 220 of electrical power from housekeeping supply 248 or startup supply 104, as applicable. Power supply controller A and B 200, 220 each receive respective controller A or B voltage feedback signal 204, 224 from voltage feedback device output 274, in turn providing a respective controller A and B modulating output signal 208, 228. Power supply controller A and B 200, 220 each receive respective controller A or B current feedback signal 206, 226 in response to current flow through respective channel A or B current feedback device 162, 202, as described earlier. Controller A and B modulating output signal 208, 228 is provided to respective gate drive circuit A and B 150, 170, as described earlier, in response to respective controller A or B voltage feedback signal 204, 224 and respective controller A or B current feedback signal 206, 226.

In the illustrated embodiment, power supply controller A and B 200, 220 each provide a respective controller A or B modulating output signal 208, 228 using a pulse width modulation (PWM) scheme. PWM is used in a switching power supply to provide a regulated output voltage with a relatively high efficiency as compared to other voltage regulation schemes. In PWM, a rectangular pulse train is provided at a particular pulse rate (i.e., frequency) to power conversion unit 190, with the width of each pulse being controlled to result in a desired output voltage level. A wider pulse generally results in more power being delivered to power conversion unit 190, thereby providing a greater current output at power supply output 256 in response to a greater load. In the illustrated embodiment, power supply controller A and B 200, 220 operate at a frequency that can range from about 50-150 KHz. In some embodiments, the frequency that can range from about 30-300 KHz. In other embodiments, the frequency can be lower than 30 KHz. In yet other embodiments, the frequency can be higher than 300 KHz. In some of these other embodiments, the frequency can be 1 MHz or higher. In describing PWM, a duty cycle can be defined as the percentage of time that a pulse exists (i.e., MOSFET A or B 158, 178 is conducting). It can be appreciated that a particular duty cycle can be dictated by the load on redundant power supply controller 100 with regard to the voltages of power supply input 15 and power supply output 256, and in various embodiments, the duty cycle can vary. In alternative embodiments, power supply controller A and/or B 200, 220 can use a modulation scheme other than PWM. Non-limiting examples of modulation schemes include pulse frequency modulation (PFM) and pulse density modulation (PDM). All modulation schemes for power supply controller A and/or B 200, 220 are within the scope of the present disclosure.

Referring again to FIG. 3, redundant power supply controller 100 includes several architectural fault mitigation techniques, as were described above. Channel A and B current limiters 210, 230 limit current flow through the respective power supply controller A or B 200, 220, as may occur curing a fault condition, thereby not depriving the unaffected power supply controller A or B 200, 220 of electrical power. Power supply controllers A and B 200, 220 each receive respective channel A or B current feedback signal 164, 204 from respective channel A or B current feedback devices 162, 202. Redundant power supply controller 100 includes controller selector circuit 110 and voltage monitoring circuit 260, which directs redundant power supply controller 100 to switch to an alternate channel in the event of a fault on the current channel, while also allowing an external signal to result in a channel transfer. The automatic channel transfer by redundant power supply controller 100 will be described in detail later, in regard to FIGS. 4A-4F.

Redundant power supply controller 100 includes COTS electronic components, which offer many advantages over the procurement of specialized electronic components, such as low cost, ready supply availability, and ease of integration. It is to be appreciated that any electronic component can be prone to failure when subjected to a particular stress. Accordingly, it is an object of the present disclosure to mitigate the possibility of a common-mode failure of power supply controller A and B 200, 220 by providing an architectural mitigation technique that addresses common-mode design errors for complex COTS power supply components relative to a system's common mode analysis, while also eliminating or reducing the possibility of one power supply controller A or B 200, 220 having an adverse impact on the other. As used in the present disclosure, an adverse impact can be defined as a fault by one controller that prevents the other controller from operating so as to provide voltage at power supply output 256 within the specified voltage tolerance. A non-limiting example of a specified voltage tolerance is +5%. For example, if a desired output voltage at power supply output 256 is 3.3 VDC±5%, the allowable tolerance band is 3.135-3.465 VDC. It is to be appreciated that in various embodiments, redundant power supply controller 100 can have various desired voltage output levels and various tolerance bands. Non-limiting examples of voltages include +15 V, −15 V, and +5V. In various embodiments, tolerance values can range from about ±1% to ±10%, however tolerance values outside of this range can also be used in some embodiments (i.e., narrower than ±1% or wider than ±10%). Moreover, in some embodiments, a particular tolerance band can be asymmetrical (e.g., +5%, −3%).

To achieve the objective of architectural common-mode fault mitigation, redundant power supply controller 100 utilizes a concept of power supply controller diversity, which can be achieved by one or more of several possible methods. As used in this disclosure, power supply controller diversity refers to a physical, structural, or operational difference between power supply controller A 200 and power supply controller B 220. The following description provides non-limiting examples of power supply controller diversity (i.e., with regard to a first and second power supply controller).

Different minimum and/or maximum duty cycles: power supply controllers A and B 200, 220 can each have a different specification for minimum and/or maximum operating duty cycle. This can be referred to as duty cycle diversity. The first power supply controller can have a first maximum operating duty cycle (i.e., measured as a percentage), and the second power supply controller can have a second maximum operating duty cycle (i.e., measured as a percentage). Accordingly, duty cycle diversity can be expressed as a percentage point (% p) difference between the first and second maximum operating duty cycle values. In an exemplary embodiment, duty cycle diversity can be at least 2% p. It is to be appreciated that a specification for minimum and/or maximum operating duty cycle can be indicative of a design structure of a particular chip (i.e., integrated circuit, silicon chip). Accordingly, duty cycle diversity can result in different chips that mitigate common-mode fault.

Different frequencies: power supply controllers A and B 200, 220 can each operate at a different pulse modulation frequency. This can be referred to as frequency diversity. In a particular embodiment, an operating frequency (i.e., pulse modulation frequency) can be a result of a minimum and/or maximum frequency that is specified for a particular controller. A non-limiting example of different frequencies is 30 KHz for a first power supply controller and 45 KHz for a second power supply controller. In some embodiments, a frequency difference of about 10% can be sufficient to provide power supply controller diversity. In these embodiments, one frequency is at least 10% higher than the other (i.e., the ratio between the higher maximum frequency and the lower maximum frequency is at least 1.1). In some embodiments, the frequency difference can be less than 10%. In other embodiments, the frequency difference can be more than 10%. It is to be appreciated that a specification for minimum and/or maximum frequency can be indicative of a design structure of a particular chip (i.e., integrated circuit, silicon chip). Accordingly, frequency diversity can result in different chips that mitigate common-mode fault.

Different power supply requirement specifications: power supply controllers A and B 200, 220 can each have a different specification for minimum and/or maximum startup voltage and/or minimum and/or maximum operating voltage. This can be referred to as power supply requirement diversity. A non-limiting example of different minimum startup voltages is 8.4 V for a first power supply controller and 9.6 V for a second power supply controller. In some embodiments, one controller can have a minimum or maximum specification voltage value that is at least 0.2 V different from that of another controller, with the particular specification voltage being any one or more of minimum startup voltage, minimum operating voltage, maximum startup voltage, maximum operating voltage. It is to be appreciated that a specification for minimum startup and/or operating voltage can be indicative of a design structure of a particular chip (i.e., integrated circuit, silicon chip). Accordingly, power supply requirement diversity can result in different chips that mitigate common-mode fault.

Different power supply controller manufacturers: power supply controllers A and B 200, 220 can each be supplied by a different manufacturer. This can be referred to as manufacturer diversity. Non-limiting examples of manufacturers of power supply controllers are ANALOG DEVICES™, TI™, MAXIM™, ST MICROELECTRONICS™, and ONSEMI™. It is to be appreciated a particular manufacturer can be indicative of a design structure of a particular chip (i.e., integrated circuit, silicon chip). Accordingly, manufacturer diversity can result in different chips that mitigate common-mode fault Different power supply controller part numbers: power supply controllers A and B 200, 220 can each have a different part number, even if supplied by the same manufacturer. This can be referred to as part number diversity. A non-limiting example of different part numbers supplied by ANALOG DEVICES™ is LT1241 for a first power supply controller and LT1243 for a for a second power supply controller. It is to be appreciated that a power supply controller part number can be indicative of a design structure of a particular chip (i.e., integrated circuit, silicon chip). Accordingly, power supply controller part number diversity can result in different chips that mitigate common-mode fault.

Different semiconductor foundries: power supply controllers A and B 200, 220 can each be manufactured at a different semiconductor foundry, even if supplied by the same manufacturer and/or having the same part number. This can be referred to as foundry diversity. It is to be appreciated that a semiconductor foundry can be indicative of a manufacturing (i.e., wafer fabrication) structure of a particular chip (i.e., integrated circuit, silicon chip). Accordingly, foundry diversity can result in different chips that mitigate common-mode fault.

Different fabrication lines: power supply controllers A and B 200, 220 can each be manufactured in a different fabrication line, even if supplied by the same manufacturer and/or having the same part number and/or manufactured in the same semiconductor foundry. This can be referred to as fabrication line diversity. It is to be appreciated that a semiconductor foundry can be indicative of a manufacturing (i.e., wafer fabrication) structure of a particular chip (i.e., integrated circuit, silicon chip). Accordingly, fabrication line diversity can result in different chips that mitigate common-mode fault.

Different fabrication batches: power supply controllers A and B 200, 220 can each be manufactured in different fabrication batches, even if supplied by the same manufacturer and/or having the same part number and/or manufactured in the same semiconductor foundry and/or manufactured in the same fabrication line. This can be referred to as fabrication batch diversity. In some embodiments, a date of manufacture (i.e., manufacturing date) can be indicative of a different fabrication batch. It is to be appreciated that a fabrication batch can be indicative of a manufacturing (i.e., wafer fabrication) structure of a particular chip (i.e., integrated circuit, silicon chip). Accordingly, fabrication batch diversity can result in different chips that mitigate common-mode fault. Moreover, manufacturing date diversity can result in different chips that mitigate common-mode fault.

The operation of redundant power supply controller 100 in response to a fault occurring in a particular power supply controller A or B 200, 220 will be described in reference to the following figures. FIG. 4A is a waveform showing the output voltage from the redundant power supply controller. FIG. 4B is a waveform showing the in regulation status of the redundant power supply controller. FIG. 4C is a waveform showing the power good status of the redundant power supply controller. FIG. 4D is a waveform showing the startup controller selection status of the redundant power supply controller. FIG. 4E is a waveform showing the controller toggle bit status of the redundant power supply controller. Shown in FIGS. 4A-4E on a common time axis are output voltage graph 300, controller A startup ramp 302, minimum voltage 304, target voltage 306, controller A steady operation 308, controller A fault occurrence 310, controller A excursion phase 312, maximum voltage 314, controller B restoration phase 316, target voltage 320, controller B steady operation 320, regulation signal graph 330, not in regulation 332, in regulation transition 334, in regulation 336, not in regulation transition 338, not in regulation 340, not in regulation period 342, in regulation transition 344, in regulation 346, power good signal graph 350, power not good 352, power good delay period 354, power good transition 356, power good 358, power not good transition 360, power good delay period 362, power good transition 364, power good 366, controller toggle bit graph 380, use startup controller 382, alternate controller transition 384, use alternate controller 386, controller enable signal graph 390, controller A enabled 392, controller B transition 394, and controller B enabled 396. In the exemplary embodiment shown in FIG. 4A, redundant power supply controller 100 is configured to provide an output voltage ($V_{out}$) of 3.3 V, with a tolerance of ±5% (i.e., 3.135-3.465 V).

After power supply input 15 is applied to redundant power supply controller 100 at t0, discrete input selector 122 programs discrete input selector output 122 to identify controller A as the startup controller. Accordingly, controller A is enabled as shown in controller enable signal graph 390, and channel A (i.e., power supply controller A 200, gate drive circuit A 150, MOSFET A 158) are supplying power to power conversion unit 190, resulting in an increase in output voltage ($V_{out}$). Initially, regulation signal graph 330 indicates not in regulation 332, and power good signal graph 350 indicates power not good 352. Controller A startup ramp 302 occurs from a soft-start function programmed into power supply controllers A and B 200, 220, thereby limiting a starting current surge. In a typical embodiment, the duration of controller A startup ramp 302 can be about 1-2 msec. The output voltage achieves minimum voltage 304 (i.e., 3.135 V) at t1, thereby producing in regulation transition 334. It is noted that power not good 352 remains on power good signal graph 350 because of power good delay period 354 in voltage monitoring circuit 260. In a typical embodiment, power good delay period 354 can be about 0.5-2 msec. The output voltage continues to increase, achieving target voltage 306 (i.e., 3.3 V) at t2, resulting in controller A steady operation 308. In the exemplary operation shown in FIGS. 4A-4F, power not good 352 persists until after target voltage 306 at t2, as a result of power good delay period 354. Thereafter, power good transition 356 occurs at t3, resulting in power good 358 status. In the absence of an internal fault or external signal, redundant power supply controller 100 can continue supplying power indefinitely, so long as power supply input 15 is applied.

Next, a fault occurring with controller A (i.e., channel A, power supply controller A 200) will be described. At controller A fault occurrence 310, controller A excursion phase 312 begins whereby the output voltage begins increasing. The output voltage achieves maximum voltage 314 (i.e., 3.465 V) at t4, thereby causing voltage monitoring circuit 260 to provide voltage monitoring input 116 to controller selector circuit 110 as described above in regard to FIG. 3. This is reflected by not in regulation transition 338 and power not good transition 360 at t4, thereby triggering alternate controller transition 384 to use alternate controller 386, and in turn controller B transition 394, thereby directing controller B enabled 396. Accordingly, controller A (i.e., channel A, power supply controller A 200) is disabled and controller B (i.e., channel B power supply controller B 220) is enabled, and controller B begins operation, resulting in controller B restoration phase 316, and ultimately achieving target voltage 320 (i.e., 3.3 V) for controller B steady operation 320. As shown in FIG. 4B, not in regulation 340 persists for not in regulation period 342. In the exemplary embodiment shown in FIG. 4B, not in regulation period 342 can be about 100-250 μsec. In other embodiments, redundant power supply controller 100 can be configured to provide not in regulation period 342 either shorter than 100 μsec or longer than 250 μsec. As shown in FIG. 4C, power good delay period 362 delays power good transition 364 until t6. In the illustrated embodiment, power good delay period 362 can be about 0.5-2 msec, and can be similar to power good delay period 354 occurring at t1.

Discussion of Possible Embodiments

The following are non-exclusive descriptions of possible embodiments of the present invention.

A power supply system for converting electrical power with redundant control, the power supply system comprising: a power conversion unit configured to provide a regulated output voltage; a first power supply controller, configured to control the power conversion unit such that the regulated output voltage is within a selected range; a second power supply controller, having a power supply controller diversity from the first power supply controller, configured to control the power conversion unit such that the regulated output voltage is within a selected range; and a controller selector, configured to enable either the first power supply controller or the second power supply controller, in response to a control signal from a logic control circuit; wherein the power supply controller diversity is selected from the group consisting of duty cycle diversity, frequency diversity, power supply requirement diversity, manufacturer diversity, part number diversity, foundry diversity, fabrication batch diversity, and manufacturing date diversity.

The power supply system of the preceding paragraph can optionally include, additionally and/or alternatively, any one or more of the following features, configurations and/or additional components:

A further embodiment of the foregoing power supply system, further comprising: a voltage monitoring circuit, configured to: monitor the regulated output voltage; provide an output supply voltage control signal; and provide a voltage level signal; whereby the logic control circuit is configured to: receive the output supply voltage control signal; receive one or more external input signals; determine an identity of one of either the first power supply controller or the second power supply controller in response to the output supply voltage control signal and the one or more external input signals; and provide a binary output signal that enables the selected one of the first power supply controller or the second power supply controller.

A further embodiment of the foregoing power supply system, wherein: the first power supply controller is configured to generate a first pulse width modulation signal representative of the voltage level signal; and the second power supply controller is configured to generate a second pulse width modulation signal representative of the voltage level signal.

A further embodiment of the foregoing power supply system, further comprising: a first gate driver circuit, configured to receive the first pulse width modulation signal and to: provide a first gate control signal representative of the first pulse width modulation signal, if the first power supply controller is enabled; and provide the first gate control signal that is zero if the first controller enable signal is not enabled; and a second gate driver circuit, configured to receive the second pulse width modulation signal and to: provide a second gate control signal representative of the second pulse width modulation signal, if the second power supply controller is enabled; and provide the second gate control signal that is zero if the second controller enable signal is not enabled.

A further embodiment of the foregoing power supply system, comprising a first and second external input signal, wherein: the first external input signal is a controller built in test command signal; and the second external input signal is a start-up controller selection command signal.

A further embodiment of the foregoing power supply system, wherein: the power supply controller diversity is duty cycle diversity; the first power supply controller has a first maximum duty cycle; and the second power supply controller has a second maximum duty cycle that is different from the first maximum duty cycle.

A further embodiment of the foregoing power supply system, wherein a difference between the first maximum duty cycle and the second maximum duty cycle is at least 2 percentage points (% p).

A further embodiment of the foregoing power supply system, wherein: the power supply controller diversity is frequency diversity; the first power supply controller has a first maximum frequency; and the second power supply controller has a second maximum frequency that is different from the first maximum frequency.

A further embodiment of the foregoing power supply system, wherein: the first maximum frequency is greater than the second maximum frequency; and a ratio between the first maximum frequency and the second maximum frequency is at least 1.1.

A further embodiment of the foregoing power supply system, wherein: the power supply controller diversity is power supply requirement diversity; and the power supply requirement diversity is selected from the group consisting of minimum startup voltage, minimum operating voltage, maximum startup voltage, and maximum operating voltage.

A further embodiment of the foregoing power supply system, wherein: the power supply requirement diversity is minimum startup voltage; the first power supply controller has a first minimum startup voltage; the second power supply controller has a second minimum startup voltage that is less than the first minimum startup voltage; a difference between the first minimum startup voltage and the second minimum startup voltage is at least 0.2 volts.

A further embodiment of the foregoing power supply system, wherein: the power supply requirement diversity is minimum operating voltage; the first power supply controller has a first minimum operating voltage; the second power supply controller has a second minimum operating voltage that is less than the first minimum operating voltage; a difference between the first minimum operating voltage and the second minimum operating voltage is at least 0.2 volts.

A further embodiment of the foregoing power supply system, wherein: the power supply requirement diversity is maximum startup voltage; the first power supply controller has a first maximum startup voltage; the second power supply controller has a second maximum startup voltage that is less than the first maximum startup voltage; a difference between the first maximum startup voltage and the second maximum startup voltage is at least 0.2 volts.

A further embodiment of the foregoing power supply system, wherein: the power supply requirement diversity is maximum operating voltage; the first power supply controller has a first maximum operating voltage; the second power supply controller has a second maximum operating voltage that is less than the first maximum operating voltage; a difference between the first maximum operating voltage and the second maximum operating voltage is at least 0.2 volts.

A further embodiment of the foregoing power supply system, wherein: the power supply controller diversity is manufacturer diversity; the first power supplier controller is from a manufacturer selected from the group consisting of ANALOG DEVICES™, TI™, MAXIM™, ST MICROELECTRONICS™, and ONSEMI™; the second power supplier controller is from a manufacturer selected from the group consisting of ANALOG DEVICES™, TI™, MAXIM™, ST MICROELECTRONICS™, and ONSEMI™; and the first power supplier controller is from a manufacturer that is different from the second power supplier controller manufacturer.

A further embodiment of the foregoing power supply system, wherein: the power supply controller diversity is part number diversity; the first power supply controller has a first part number; and the second power supply controller has a second part number that is different from the first part number.

A further embodiment of the foregoing power supply system, wherein: the power supply controller diversity is fabrication batch diversity; the first power supply controller has a first date of manufacture; and the second power supply controller has a second date of manufacture that is different from the first date of manufacture.

A method for converting electrical power with redundant control, comprising: providing a regulated output voltage by a power conversion unit; controlling the power conversion unit by a first power supply controller such that the regulated output voltage is within a selected range; controlling the power conversion unit by a second power supply controller having a power supply controller diversity from the first power supply controller such that the regulated output voltage is within a selected range; and enabling, by a controller selector, either the first power supply controller or the second power supply controller in response to a control signal from a logic control circuit; wherein the power supply controller diversity is selected from the group consisting of duty cycle diversity, frequency diversity, power supply requirement diversity, manufacturer diversity, part number diversity, foundry diversity, fabrication batch diversity, and manufacturing date diversity.

The method of the preceding paragraph can optionally include, additionally and/or alternatively, any one or more of the following features, configurations and/or additional components:

A further embodiment of the foregoing method, wherein: the power supply controller diversity is manufacturer diversity; the first power supplier controller is from a manufacturer selected from the group consisting of ANALOG DEVICES™, TI™, MAXIM™, ST MICROELECTRONICS™, and ONSEMI™; the second power supplier controller is from a manufacturer selected from the group consisting of ANALOG DEVICES™, TI™, MAXIM™, ST MICROELECTRONICS™, and ONSEMI™; and the first power supplier controller is from a manufacturer that is different from the second power supplier controller manufacturer.

A further embodiment of the foregoing method, wherein: the power supply controller diversity is part number diversity; the first power supply controller has a first part number; and the second power supply controller has a second part number that is different from the first part number.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A power supply system for converting electrical power with redundant control, the power supply system comprising:
 a power conversion unit configured to provide a regulated output voltage;
 a first power supply controller, configured to control the power conversion unit such that the regulated output voltage is within a selected range;
 a second power supply controller, having a power supply controller diversity from the first power supply controller, configured to control the power conversion unit such that the regulated output voltage is within a selected range; and
 a controller selector, configured to enable either the first power supply controller or the second power supply controller, in response to a control signal from a logic control circuit;
 wherein:
  the first power supply controller has a first controller power input requirement defining a first input voltage characteristic;
  the second power supply controller has a second controller power input requirement defining a second input voltage characteristic;
  the power supply controller diversity is a diversity between the first controller power input requirement and the second controller power input requirement that is selected from the group consisting of minimum startup voltage, minimum operating voltage, maximum startup voltage, and maximum operating voltage; and
  a difference between the first input voltage characteristic and the second input voltage characteristic is at least 0.2 volts.

2. The power supply system of claim 1, further comprising:
 a voltage monitoring circuit, configured to:
  monitor the regulated output voltage;
  provide an output supply voltage control signal; and
  provide a voltage level signal;
 whereby the logic control circuit is configured to:
  receive the output supply voltage control signal;
  receive one or more external input signals;
  determine an identity of one of either the first power supply controller or the second power supply controller in response to the output supply voltage control signal and the one or more external input signals; and
  provide a binary output signal that enables the selected one of the first power supply controller or the second power supply controller.

3. The power supply system of claim 1, wherein:
 the first power supply controller is configured to generate a first pulse width modulation signal representative of the voltage level signal; and
 the second power supply controller is configured to generate a second pulse width modulation signal representative of the voltage level signal.

4. The power supply system of claim 1, further comprising:
 a first gate driver circuit, configured to receive the first pulse width modulation signal and to:
  provide a first gate control signal representative of the first pulse width modulation signal, if the first power supply controller is enabled; and
  provide the first gate control signal that is zero if the first controller enable signal is not enabled; and
 a second gate driver circuit, configured to receive the second pulse width modulation signal and to:
  provide a second gate control signal representative of the second pulse width modulation signal, if the second power supply controller is enabled; and provide the second gate control signal that is zero if the second controller enable signal is not enabled.

5. The power supply system of claim 1, comprising a first and second external input signal, wherein:
the first external input signal is a controller built in test command signal; and
the second external input signal is a start-up controller selection command signal.

6. The power supply system of claim 1, wherein:
the first power supply controller has a first maximum duty cycle; and
the second power supply controller has a second maximum duty cycle that is different from the first maximum duty cycle.

7. The power supply system of claim 1, wherein:
the first power supply controller has a first maximum frequency; and
the second power supply controller has a second maximum frequency that is different from the first maximum frequency.

8. The power supply system of claim 1, wherein:
the diversity between the first controller power input requirement and the second controller power input requirement is minimum startup voltage;
the first power supply controller has a first minimum startup voltage;
the second power supply controller has a second minimum startup voltage that is less than the first minimum startup voltage;
a difference between the first minimum startup voltage and the second minimum startup voltage is at least 0.2 volts.

9. The power supply system of claim 1, wherein:
the diversity between the first controller power input requirement and the second controller power input requirement is minimum operating voltage;
the first power supply controller has a first minimum operating voltage;
the second power supply controller has a second minimum operating voltage that is less than the first minimum operating voltage;
a difference between the first minimum operating voltage and the second minimum operating voltage is at least 0.2 volts.

10. The power supply system of claim 1, wherein:
the diversity between the first controller power input requirement and the second controller power input requirement is maximum startup voltage;
the first power supply controller has a first maximum startup voltage;
the second power supply controller has a second maximum startup voltage that is less than the first maximum startup voltage;
a difference between the first maximum startup voltage and the second maximum startup voltage is at least 0.2 volts.

11. The power supply system of claim 1, wherein:
the diversity between the first controller power input requirement and the second controller power input requirement is maximum operating voltage;
the first power supply controller has a first maximum operating voltage;
the second power supply controller has a second maximum operating voltage that is less than the first maximum operating voltage;
a difference between the first maximum operating voltage and the second maximum operating voltage is at least 0.2 volts.

12. The power supply system of claim 1, wherein:
the first power supply controller is from a first manufacturer selected from the group consisting of ANALOG DEVICES™, TI™, MAXIM™, ST MICROELECTRONICS™, and ONSEMI™;
the second power supply controller is from a second manufacturer selected from the group consisting of ANALOG DEVICES™, TI™, MAXIM™, ST MICROELECTRONICS™, and ONSEMI™; and
the first manufacturer is different from the second manufacturer.

13. The power supply system of claim 1, wherein:
the first power supply controller has a first part number; and
the second power supply controller has a second part number that is different from the first part number.

14. The power supply system of claim 1, wherein:
the first power supply controller has a first date of manufacture; and
the second power supply controller has a second date of manufacture that is different from the first date of manufacture.

15. The power supply system of claim 6, wherein a difference between the first maximum duty cycle and the second maximum duty cycle is at least 2 percentage points (% p).

16. The power supply system of claim 7, wherein:
the first maximum frequency is greater than the second maximum frequency; and
a ratio between the first maximum frequency and the second maximum frequency is at least 1.1.

17. A method for converting electrical power with redundant control using a first power supply controller having a first controller power input requirement defining a first input voltage characteristic and a second power supply controller having a second controller power input requirement defining a second input voltage characteristic, the method comprising:
providing a regulated output voltage by a power conversion unit;
controlling the power conversion unit by the first power supply controller such that the regulated output voltage is within a selected range;
controlling the power conversion unit by the second power supply controller having a power supply controller diversity from the first power supply controller such that the regulated output voltage is within a selected range; and
enabling, by a controller selector, either the first power supply controller or the second power supply controller in response to a control signal from a logic control circuit;
wherein:
the power supply controller diversity is a diversity between the first controller power input requirement and the second controller power input requirement that is selected from the group consisting of minimum startup voltage, minimum operating voltage, maximum startup voltage, and maximum operating voltage; and
a difference between the first input voltage characteristic and the second input voltage characteristic is at least 0.2 volts.

18. The method of claim 17, wherein:
the first power supply controller is from a first manufacturer selected from the group consisting of ANALOG DEVICES™, TI™, MAXIM™, ST MICROELECTRONICS™, and ONSEMI™;
the second power supply controller is from a second manufacturer selected from the group consisting of ANALOG DEVICES™, TI™, MAXIM™, ST MICROELECTRONICS™, and ONSEMI™; and
the first manufacturer is different from the second manufacturer.

19. The method of claim 17, wherein:
the first power supply controller has a first part number; and
the second power supply controller has a second part number that is different from the first part number.

* * * * *